US006623594B1

(12) United States Patent
Yamamoto et al.

(10) Patent No.: US 6,623,594 B1
(45) Date of Patent: Sep. 23, 2003

(54) HOT-MELT SHEET FOR HOLDING AND PROTECTING SEMICONDUCTOR WAFERS AND METHOD FOR APPLYING THE SAME

(75) Inventors: Kazuhiko Yamamoto, Osaka (JP); Yuzo Akada, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/348,344

(22) Filed: Jul. 8, 1999

(30) Foreign Application Priority Data

Jul. 22, 1998 (JP) .......................................... 10-222410

(51) Int. Cl.$^7$ .............................. B32B 31/00; B32B 7/12
(52) U.S. Cl. ................... 156/344; 156/327; 156/275.5; 428/354; 428/343; 428/345; 428/356; 428/355 AC
(58) Field of Search ................................ 428/354, 343, 428/345, 356, 355 AC; 156/275.5, 329, 327, 344

(56) References Cited

U.S. PATENT DOCUMENTS

| 4,999,242 | A | * | 3/1991 | Ishiwata et al. | ............ 428/345 |
| 5,187,007 | A | * | 2/1993 | Ebe et al. | ................... 428/343 |
| 5,304,418 | A | * | 4/1994 | Akada et al. | ............... 428/345 |
| 5,476,565 | A | | 12/1995 | Akada et al. | |
| 5,538,771 | A | * | 7/1996 | Nakayama et al. | ........ 428/41.3 |
| 6,176,966 | B1 | * | 1/2001 | Tsujimoto et al. | .......... 156/344 |

FOREIGN PATENT DOCUMENTS

| DE | 32 35 203 A1 | 3/1984 |
| JP | A-3-152942 | 6/1991 |
| JP | A-3-268345 | 11/1991 |
| JP | A-5-25439 | 2/1993 |

OTHER PUBLICATIONS

PAJ (JP–A–5–25439).
PAJ (JP–A–3–152942).
PAJ (JP–A–3–268345).
European Search Report.

* cited by examiner

*Primary Examiner*—Daniel Zirker
(74) *Attorney, Agent, or Firm*—Sughrue Mion, PLLC

(57) ABSTRACT

A sheet for holding and protecting semiconductor wafers which can closely follow up even a wafer surface having large roughness is disclosed. The hot-melt sheet for holding and protecting semiconductor is applied to a surface of a semiconductor wafer to thereby hold and protect the semiconductor wafer in processing the semiconductor wafer. The sheet comprises a hot-melt layer A having a melting point of 105° C. or below. A pressure-sensitive adhesive layer B may be formed on one surface of the hot-melt layer A. A reinforcing layer C having a melting point higher by 20° C. or more than that of hot-melt layer A may further be formed on one surface of the hot-melt layer A, provided that when the pressure-sensitive adhesive layer B is formed on one surface of the hot-melt layer A, the reinforcing layer C is formed on the opposite surface thereof.

4 Claims, 1 Drawing Sheet

HOT-MELT SHEET FOR HOLDING AND PROTECTING SEMICONDUCTOR WAFERS AND METHOD FOR APPLYING THE SAME

FIELD OF THE INVENTION

This invention relates to a hot-melt sheet for holding and protecting semiconductor wafers, that is used in processing semiconductor wafers comprising silicone, gallium-arsenic, or the like, and a method for applying the same. More particularly, it relates to a hot-melt sheet that is applied by heat-fusion to a surface of a semiconductor wafer on which a circuit pattern has been formed (hereinafter referred to as a "patterned surface" for simplicity) in polishing and grinding a back surface thereof, thereby protecting the patterned surface and, at the same time, holding the thus thinned semiconductor wafer, and a method for applying the same.

BACKGROUND OF THE INVENTION

Where a semiconductor wafer is polished and ground on its surface opposite a surface having a circuit pattern formed thereon, the patterned surface must be protected from damage or contamination with grinding dusts, grinding water, etc. Further, the semiconductor wafer itself is thin and brittle, and also a patterned face of the semiconductor wafer has an uneven form, there is the problem that semiconductor wafers tend to be broken even if a slight external force is applied thereto.

In order to attempt protection of the patterned face of semiconductor wafers and prevention of them from breakage in processing the semiconductor wafers, a method of applying a pressure-sensitive adhesive sheet to the patterned surface of semiconductor wafers is known. For example, JP-A-61-10242 discloses a film for processing semiconductor wafers which comprises a substrate sheet having a Shore D hardness of 40 or less and a pressure-sensitive adhesive layer formed on the surface thereof. (The term "JP-A" as used herein means an "unexamined published Japanese patent application".) Further, JP-A-61-260629 discloses a film for processing wafers which comprises a substrate film having a Shore D hardness of 40 or less, an auxiliary film having a Shore D hardness exceeding 40 laminated on one surface of the substrate film, and a pressure-sensitive adhesive layer formed on the other surface of the substrate film.

In recent years, roughness on a patterned surface of semiconductor wafers is increasing. For example, wafers provided with a polyimide film have the roughness of about 1 to 20 μm. Further, bad marks for recognizing defective semiconductor chips have roughness of about 10 to 70 μm. Also, height of bumps formed on patterned electrodes is about 20 to 200 μm. For those reasons, in the method of using conventional pressure-sensitive adhesive sheet, the conventional adhesive sheets cannot follow up the unevenness, resulting in insufficient adhesion between the pressure-sensitive adhesive and the wafer surface. As a result, peeling of sheets, invasion of grinding water or foreign matters into the patterned surface, processing errors, dimpling, or the like may occur, and also wafers may break, in processing wafers.

SUMMARY OF THE INVENTION

Accordingly, one object of the present invention is to provide a sheet for holding and protecting semiconductor wafers, which can closely follow up unevenness on a wafer surface even if the roughness thereof is large, and a method for applying the same.

Another object of the present invention is to provide a sheet for holding and protecting semiconductor wafers, which has excellent release properties from the wafer surface and small staining properties to the wafer surface, and a method for applying the same.

Still another object of the present invention is to provide a sheet for holding and protecting semiconductor wafers, which has excellent application workability and also has high holding and reinforcing properties to wafers, and a method for applying the same.

As a result of extensive investigations to achieve the above-described objects, it has been found that a sheet provided with a hot-melt layer having a specific melting point well follows up unevenness on a semiconductor wafer surface even if the roughness is large and, after completion of the grinding process, the sheet can easily be released from the wafer surface without staining the same. The present invention has been completed based on this finding.

According to a first embodiment of the present invention, there is provided a hot-melt sheet for holding and protecting semiconductor wafers by applying to a surface of a semiconductor wafer to thereby hold and protect the semiconductor wafer in processing the semiconductor wafer, the sheet comprising a hot-melt layer A having a melting point of 105° C. or lower.

According to a second embodiment of the present invention, there is provided a method for applying a hot-melt sheet for holding and protecting semiconductor wafers to a surface of a semiconductor wafer, which comprises laminating the hot-melt sheet for holding and protecting semiconductor wafers as described above on the semiconductor wafer, and then heating the hot-melt sheet to apply the sheet to the wafer In the above method, where a pressure-sensitive adhesive layer B is formed on one surface of the hot-melt layer A, the resulting sheet is laminated in such a manner that the pressure-sensitive adhesive layer B faces the semiconductor wafer.

In these Figures, each numerical symbol has the following meaning:

| | |
|---|---|
| 1 | Hot-melt layer |
| 2 | Pressure-sensitive adhesive layer |
| 3 | Reinforcing layer |
| 4 | Release film layer |

DETAILED DESCRIPTION OF THE INVENTION

The term "melting point" as used herein means a value measured in accordance with ASTM D3418.

The embodiments of the present invention are described in detail by reference to the accompanying drawings, if necessary.

FIGS. 1 to 5 each show a schematic sectional view showing an example of the hot-melt sheet for holding and protecting semiconductor wafers according to the present invention. In these figures, members or parts having the same meaning are by the same symbol.

Figure 1:
FIG. 1 is a schematic sectional view showing one example of the hot-melt sheet for holding and protecting semiconductor wafers according to the present invention.

In the example shown in FIG. 1, a hot-melt sheet for holding protecting semiconductor wafers consists of a hot-melt layer 1 alone.

The hot-melt layer 1 has a melting point of 105° C. or below (for example, 30 to 105° C.), preferably 100° C. or below (for example, 30 to 100° C.), and more preferably about 40 to 80° C. If the melting point of the hot-melt layer 1 exceeds 105° C., high temperature of about 120° C. or higher is required to sufficiently melt the hot-melt layer 1 in applying the hot-melt sheet to the patterned surface of a semiconductor wafer, which brings about disadvantages from the standpoint of handling properties or equipment. Further, even if the application treatment is conducted at high temperature, it is difficult to completely fill the patterned surface of the wafer with the components constituting the hot-melt layer 1. In addition, an interfacial stress tends to generate due to difference in a linear expansion coefficient between the wafer and the sheet in cooling. As a result, the wafer tends to break in grinding a back surface of the wafer. Further, there are many cases that the hot-melt layer 1 strongly adheres to the wafer and it is difficult to release the holt-melt layer from the wafer. If the hot-melt layer 1 has a melting point lower than 30° C., the sheet softens by a slight temperature rise in grinding the back surface of the wafer. As a result, the wafer-holding property of the sheet decreases, which frequently causes cracking of the wafer.

The thickness of the hot-melt layer 1 can appropriately be selected within the range that the holding property and the protective property of the wafer are not impaired. The thickness of the hot-melt layer 1 is generally 20 to 1000 μm, and preferably 50 to 500 μm. If the thickness of the hot-melt layer 1 is less than 20 μm, it becomes difficult for the sheet to exhibit the follow-up property thereof to unevenness of the patterned surface of the wafer, and the wafer tends to suffer from cracking or dimpling in the grinding step of the wafer. On the other hand, if the thickness of the hot-melt layer 1 exceeds 1000 μm, it takes a long time to apply the sheet, thereby lowering the working efficiency. In addition, in releasing the sheet from the wafer, the thin wafer after grinding may break due to a bending stress of the sheet.

The hot-melt layer 1 comprises a hot-melt material which melts and/or softens by heating. Any hot-melt material may be used so long as it can regulate the melting point of the hot-melt layer 1 within the range as defined above. Examples of the hot-melt material include thermoplastic resins and waxes. The hot-melt material has a melting point of preferably about 105° C. or below (for example, 30 to 105° C.), more preferably about 30 to 100° C. and most preferably about 40 to 80° C. The hot-melt materials can be used alone or as mixtures thereof. Considering the wafer-holding property, release property from the wafer, prevention of the wafer surface from stain, etc., the hot-melt layer 1 preferably contains at least a thermoplastic resin.

Examples of the thermoplastic resin which can be used include polyethylene (PE); polybutene; polyolefin copolymers such as ethylene copolymers or modified polyolefin polymers, for example, ethylene/ethyl acrylate copolymer (EEA), ethylene/ethyl acrylate/maleic anhydride copolymer (EEAMAH), ethylene/glycidyl methacrylate copolymer (EGMA), ethylene/methacrylic acid copolymer (EMAA), ethylene/vinyl acetate copolymer (EVA) and ionomer resins (IONO); thermoplastic elastomers such as butadiene elastomers (TPE-B), ester elastomers (TPE-E) and styrene/isoprene elastomers (TPE-SIS); thermoplastic polyester; polyamide resins such as polyamide 12 copolymer; polyurethanes; polystyrene resins; cellophane; polyacrylonitrile; acrylic resins such as methyl methacrylate; and polyvinyl chloride resins such as vinyl chloride/vinyl acetate copolymer.

Of those materials, the following materials are frequently used: low density polyethylene (LDPE) (for example, polyethylene having a density of 0.90 to 0.96 g/cm$^3$, preferably 0.91 to 0.94 g/cm$^3$); polyolefin copolymers such as ethylene copolymers, for example, ethylene/ethyl acrylate copolymer (EEA), ethylene/vinyl acetate copolymer (EVA) (for example, EVA containing from 60 to 90% by weight of ethylene and from 10 to 40% by weight of vinyl acetate, preferably EVA containing form 50 to 90% by weight of ethylene and from 5 to 50% by weight of vinyl acetate) and ionomer resins (IONO); thermoplastic high molecular weight polyester (for example, VYLON™ GV100 and VYLON™ GV700) ; and thermoplastic elastomers. Those thermoplastic resins can be used alone or in a combination of two or more thereof.

The hot-melt layer 1 may comprise the hot-melt material alone, but it may contain other components (additives) in the range that the characteristics (melting properties, release properties, etc.) do not deteriorate. Examples of such additives include tackifiers, plasticizers, softeners, fillers, and antioxidants. The hot-melt layer 1 may be constituted of a single layer, but may have a multi-layered structure of two or more layers which are either the same or different each other.

The hot-melt sheet as shown in FIG. 1 can be produced by, for example, molding a composition containing the hot-melt material into a sheet by the conventional molding method, such as an extrusion molding.

Since the hot-melt sheet for holding and protecting semiconductor wafers according to the present invention has at least one hot-melt layer 1 which melts and/or softens by heating, the sheet can be applied to the patterned surface of a semiconductor wafer by fluidizing the hot-melt layer 1 with a heating means. In this case, the fluidized hot-melt material can follow up uneven portion of the patterned surface to spread to the entire surface. Therefore, even if the patterned surface has large unevenness, the material can well absorbs step marks to follow up along the surface shape. As a result, any gap is not formed between the semiconductor wafer and the hot-melt sheet, and the sheet does not peel in grinding processing of the wafer, thereby preventing invasion of grinding water or foreign matters, processing errors, dimpling, breakage of the wafer, etc. Further, since the hot-melt layer 1 has a low melting point of 105° C. or below, the hot-melt sheet can be applied by using a simple heating device and by an easy heating operation. At the same time, the resin can be surely filled even into a small space in uneven portion of the patterned surface within a short period of time. Moreover, the hot-melt layer 1, which adheres to the wafer usually at an appropriate adhesive strength, can be softened by merely slightly heating. As a result, after completion of the grinding, the hot-melt sheet can be easily and surely released without staining the wafer surface.

Figure 2:
FIG. 2 is a schematic sectional view showing another example of the hot-melt sheet for holding and protecting semiconductor wafers according to the present invention.

In the example shown in FIG. 2, the hot-melt sheet for holding and protecting semiconductor wafers is constituted of a hot-melt layer 1 and a pressure-sensitive adhesive layer 2 formed on one surface of the hot-melt layer 1.

The pressure-sensitive adhesive constituting the adhesive layer 2 is the conventional pressure-sensitive adhesives, and the examples thereof include copolymers of acrylic monomers (acrylic adhesives), silicone pressure-sensitive adhesives and rubber adhesives. Of those, acrylic adhesives are preferably used. Those adhesives may be used alone or as a mixture of two or more thereof.

The polymer constituting the adhesive may have a crosslinked structure. Such a polymer can be obtained by polymerizing a monomer mixture containing monomers (for example, acrylic monomers) having functional groups such as carboxyl, hydroxyl, epoxy and amino groups in the presence of a crosslinking agent. A hot-melt sheet provided with such a pressure-sensitive adhesive layer 2 containing a polymer having a crosslinked structure has improved self-retention property, thereby preventing deformation and maintaining the sheet in a flat plate state. As a result, hot-melt sheets of this type can be easily and accurately adhered to semiconductor wafers using an automatic applicator, etc.

An ultraviolet-curing pressure-sensitive adhesive can also be used as the pressure-sensitive adhesive. Such a pressure-sensitive adhesive can be obtained by, for example, blending an oligomer component which cures upon UV-irradiation to form a low adhesive substance, with a pressure-sensitive material. If the pressure-sensitive adhesive layer 2 is constituted of the ultraviolet-curing pressure-sensitive adhesive, the above oligomer component imparts a plastic fluidity to the pressure-sensitive adhesive in applying the hot-melt sheet. As a result, application of the sheet becomes easy, and also since a low adhesive substance is formed by UV irradiation in releasing the sheet, the sheet can be easily released from the wafer.

The pressure-sensitive adhesive layer 2 may further contain a component which foams or expands by heating. Examples of the heat foamable or expandable component include heat-expandable microspheres comprising elastic shells and substances easily gasified upon heating (isobutane, propane, etc.) encapsulated therein (for example, MICROSPHERE™ manufactured by Matsumoto Yushi Seiyaku K.K.). If the pressure-sensitive adhesive layer 2 contains such a heat-foamable or heat-expandable component, the pressure-sensitive adhesive layer 2 is expanded by heating after completion of grinding. As a result, the contact area of the pressure-sensitive adhesive layer 2 with the wafer largely decreases and the hot-melt sheet can be easily released from the wafer.

The thickness of the pressure-sensitive adhesive layer 2 can be appropriately determined within the range that the wafer-holding and protecting properties of the hot-melt sheet are not impaired. The thickness of the pressure-sensitive adhesive layer is generally 1 to 100 µm, and preferably 2 to 60 µm. If the thickness of the pressure-sensitive adhesive layer exceeds 100 µm, the resulting hot-melt sheet is difficult to follow up the unevenness on the wafer surface. The ratio of the thickness of the pressure-sensitive adhesive layer 2 ($t_2$) to the thickness of the hot-melt layer 1 ($t_1$), i.e., $t_2/t_1$, is 0.01 to 0.5, and preferably 0.02 to 0.3.

The hot-melt sheet shown in FIG. 2 can be produced by, for example, molding a composition containing the hot-melt material as described above into a sheet by the conventional molding method (for example, extrusion molding) and then applying a pressure-sensitive adhesive to one surface of the thus obtained sheet (corresponding to the hot-melt layer 1) followed by drying to form a pressure-sensitive adhesive layer 2.

In the hot-melt sheet provided with the pressure-sensitive adhesive layer 2, the pressure-sensitive adhesive layer 2 is located between the wafer and the hot-melt layer 1. Therefore, after completion of the grinding, the hot-melt sheet can be easily and surely released from the wafer without leaving any pieces of the hot-melt material on the wafer surface.

Figure 3:
FIG. 3 is a schematic sectional view showing still another example of the hot-melt sheet for holding and protecting semiconductor wafers according to the present invention.

The hot-melt sheet for holding and protecting semiconductor wafers as shown in FIG. 3 is constituted of a hot-melt layer 1 and a reinforcing layer 3 formed on one surface of the hot-melt layer 1.

The reinforcing layer 3 has a melting point higher by 20° C. or more, preferably by 30° C. or more, than that of the hot-melt layer 1. The material constituting the reinforcing layer 3 is not particularly limited so long as it has a melting point satisfying the above requirement. Examples the material include thermoplastic resins, for example, polyesters such as polyethylene terephthalate (PET); polyolefin resins such as polyethylene (PE) and polypropylene (PP); polyimides (PI); polyether ether ketones (PEEK); polyvinyl chloride resins such as polyvinyl chloride (PVC); polyvinylidene chloride resins; polyamide resins; polyurethanes; polystyrene resins; acrylic resins, fluororesins; cellulose resins; and polycarbonate resins, and further include thermosetting resins, metal foils and papers. As the material constituting the reinforcing layer 3, resins exemplified as the thermoplastic resin constituting the hot-melt layer 1 can also be used so long as the requirement for the melting point as defined above is satisfied. Those materials may be used alone or as a combination of two or more thereof. The reinforcing layer 3 may have a multi-layered structure comprising a plurality of layers which are the same or different each other.

The hot-melt sheet shown in FIG. 3 can be produced by the conventional method, for example, a lamination method (for example, extrusion lamination or dry lamination) or a coating method using a sheet comprising the hot-melt material constituting the hot-melt layer 1 or a composition containing the hot-melt material, and the material constituting the reinforcing layer 3 or a composition containing the material. Specifically, when both the hot-melt layer 1 and the reinforcing layer 3 are in the form of sheet, lamination method is used; when either of the hot-melt layer 1 and the reinforcing layer 3 is in the form of composition, and the another is in the form of sheet, a coating method is used; and when both the hot-melt layer 1 and the reinforcing layer 3 are in the form of composition, an extrusion method is used.

In the hot-melt sheet provided with the reinforcing layer 3, the reinforcing layer 3 does not melt in the step of the heat application. Therefore, the hot-melt sheet can be applied to the reinforcing layer 3 by applying pressure from the reinforcing layer side. Consequently, workability in application is good and also follow-up property to unevenness on the wafer surface is greatly improved. Further, in applying the hot-melt sheet to a wafer under pressing, the hot-melt layer 1 melts or softens, and therefore follows up the wafer surface, while the hot-melt sheet surface can maintain a flat plate shape due to the reinforcing layer 3 which does not melt. As a result, occurrence of dimpling in the wafer processing can be decreased. Further, even after completion of the wafer processing, the reinforcing and holding properties to the wafer by the reinforcing layer 3 can be improved.

Figure 4:
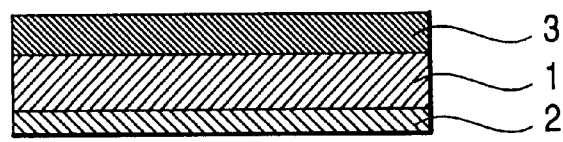
FIG. 4 is a schematic sectional view showing further example of the hot-melt sheet for holding and protecting semiconductor wafers according to the present invention.

In the example shown in FIG. 4, the hot-melt sheet for holding and protecting semiconductor wafers is constituted of a hot-melt layer 1, a pressure-sensitive adhesive layer 2 formed on one surface of the hot-melt layer 1 and a reinforcing layer 3 formed on another surface of the hot-melt layer 1. This hot-melt sheet can be produced by using the same methods as used in producing the hot-melt sheets of FIGS. 1 to 3 or by appropriately combining these methods. Because of having the pressure-sensitive adhesive layer 2 and the reinforcing layer 3, this hot-melt sheet has the advantages of both of the hot-melt sheets of FIGS. 2 and 3.

Figure 5:
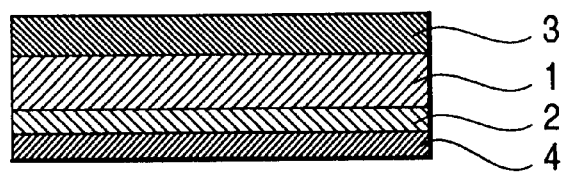
FIG. 5 is a schematic sectional view showing still further example of the hot-melt sheet for holding and protecting semiconductor wafers according to the present invention.

The hot-melt sheet for holding and protecting semiconductor wafers as shown in FIG. 5 differs from the hot-melt sheet of FIG. 4 in only that a release film layer 4 is formed on the surface of the adhesive layer 2. Examples of the release film constituting the release film layer 4 include plastic films (polyethylene terephthalate, polypropylene, etc.) or papers, treated with silicone or fluorine; and non-polar materials such as polyethylene and polypropylene (in particular, non-polar polymers). The release film layer 4 can be formed by, for example, the conventional laminating or coating method as described above.

The release film layer 4 may be formed on the surface of either the hot-melt layer 1 or the pressure-sensitive adhesive layer 2 in the hot-melt sheets of FIGS. 1 to 4. Formation of the release film layer 4 makes it possible to protect the pressure-sensitive adhesive layer 2 or the hot-melt layer 1 until using.

The hot-melt sheet for holding and protecting semiconductor wafers according to the present invention may be wound into a tape form.

The hot-melt sheet for holding and protecting semiconductor wafers can be applied to a semiconductor wafer by superposing the hot-melt sheet on a surface (circuit-patterned surface) of the semiconductor wafer in such a manner that the surface of the hot-melt layer 1 or the surface of the pressure-sensitive adhesive layer 2, if formed on one surface of the hot-melt layer 1, faces the side of the wafer; fluidizing the hot-melt layer 1 by heating; and then cooling the same.

More specifically, the hot-melt sheet for holding and protecting semiconductor wafers can be applied to a semiconductor wafer, for example, in the following manner.

(i) A wafer is placed on a hot plate (a heating table) provided with a heating means. The hot-melt sheet is superposed on the wafer in such a manner that the hot-melt layer 1 (or the pressure-sensitive adhesive layer 2, if formed) faces the side of the wafer. The hot plate is heated to a temperature enough to melt or soften the hot-melt layer 1 to thereby fluidize the same (for example, a temperature higher by 10° C., preferably by 15° C., than the melting point of the hot-melt layer 1) followed by cooling by, for example, allowing to stand. Thus, the hot-melt sheet can be applied to the wafer. If required and necessary, application of the hot-melt sheet may be carried out under pressing using, for example, a press roll. The hot plate may be preliminarily heated to an appropriate temperature, for example, the application temperature.

(ii) The hot-melt sheet is superposed on the wafer in a thermoregulated container (for example, an autoclave) and the container is heated to the above-described temperature followed by cooling, thereby applying the hot-melt sheet to the wafer. In this case, application of the hot-melt sheet may be carried out under pressing using an appropriate means. When the hot-melt sheet has a pressure-sensitive adhesive layer 2, the hot-melt sheet may be tentatively fixed to the wafer through the pressure-sensitive adhesive layer 2 and the assembly is placed in the above container followed by heating, thereby applying the hot-melt sheet to the wafer.

(iii) The hot-melt sheet can be applied to the wfer in the same manner as in (i) above in a vacuum chamber.

After completion of the grinding, the hot-melt sheet thus applied to the semiconductor wafer can be easily released therefrom either by a human force or a machine. If an integrated product of the hot-melt sheet and the wafer is heated in the releasing the hot-melt sheet, the hot-melt layer softens to thereby further facilitate the releasing. Hot water or hot air stream may be used for heating. It is also possible to remove the hot-melt sheet from the wafer by melting or softening the hot-melt layer 1 or dissolving the same in an appropriate solvent.

In the hot-melt sheet for holding and protecting semiconductor wafers and the method for applying the same according to the present invention, the hot-melt sheet has at least a hot-melt layer having a specific melting point, and the sheet is applied to the semiconductor wafer by heating the hot-melt layer. Therefore, the hot-melt sheet can closely follow up the wafer surface even though the wafer surface has large roughness. As a result, the holding and protecting sheet can adhere tightly to the wafer without forming any gap, thereby preventing invasion of grinding water or foreign matters in a wafer patterned surface, processing errors, occurrence of dimpling, breakage of the wafer, etc., in grinding the back surface of the wafer.

The holding and protecting sheet adheres to the wafer at an appropriate adhesion strength, and the sheet can be softens merely by slightly heating. As a result, the sheet can be easily released from the wafer surface without staining the same.

Further, the hot-melt sheet has excellent application workability and also has high reinforcing property and holding property to the wafer.

The hot-melt sheet having a pressure-sensitive adhesive layer can improve release property from the wafer and also considerably prevent the wafer surface from staining.

The hot-melt sheet having a reinforcing layer shows further improved workability in heat application, improved processability in grinding the wafer and enhanced reinforcing and holding properties to the wafer.

The present invention is described in more detail by the following examples, it should be understood that the invention is not construed as being limited thereto.

The semiconductor wafer used in each example was one having a wafer size of 5 inches and a thickness (excluding bumps) of 625 µm and having on one face thereof bumps of 100 to 150 µm in height and 250 µm in pitch.

The pressure-sensitive adhesives used in those examples are as follows.

A1 (Solution Type Pressure-sensitive Adhesive)

A pressure-sensitive adhesive prepared by simultaneously polymerizing 95 parts by weight of butyl acrylate, 5 parts by weight of acrylic acid and 0.2 parts by weight of azobisisobutyronitrile in ethyl acetate; and adding, to 100 parts by weight of the thus obtained polymer, 5 parts by weight of an isocyanate crosslinking agent and 0.1 part by weight of an epoxy crosslinking agent.

A2 (Emulsion Type Pressure-sensitive Adhesive)

A pressure-sensitive adhesive prepared by adding 70 parts by weight of butyl acrylate, 28 parts by weight of butyl methacrylate, 2 parts by weight of acrylic acid and 0.1 part by weight of 2,2-azobis(2-amidinopropane)dihydrochloride (an initiator) to 100 parts by weight of water containing 0.5 parts by weight of polyoxyethylene nonylphenyl ether (an emulsifier); emulsion-polymerizing the same; and adding, to the thus obtained polymer, 4 parts by weight, per 100 parts by weight of the solid matters of the polymer, of a melamine crosslinking agent.

A3 (UV-curing Adhesive)

A pressure-sensitive adhesive prepared by adding, to 100 parts by weight of the polymer obtained in the same manner as in A1 above, 100 parts by weight of dipentaerythritol hexaacrylate and 5 parts by weight of a photopolymerization initiator.

The hot-melt sheet was applied "under heating" to the wafer surface (bumps formed surface) by the following methods. M1 (Application While Heating)

The wafer was put on a heating table having been heated to a temperature at which the hot-melt layer of a hot-melt sheet melted or softened to fluidize. The hot-melt sheet was superposed thereon such that the hot-melt layer (or the pressure-sensitive adhesive layer, if formed) faced the side of the wafer, and applied thereto using a press roll.

M2 (Application Followed by Heating)

A hot-melt sheet was superposed on the wafer such that the adhesive layer faced the side of the wafer. After tentatively fixing, the composite was introduced into an autoclave having been heated to a temperature at which the hot-melt layer melted or softened to fluidize, and fused.

M3 (Application while Heating)

In a vacuum chamber, the wafer was put on a heating table having been heated to a temperature at which the hot-melt layer melted or softened to fluidize. The hot-melt sheet was superposed on the wafer such that the hot-melt layer (or the pressure-sensitive adhesive layer, if formed) faced the side of the wafer, and fused.

EXAMPLE 1

A polyethylene film (PE-1) having a melting point of 98° C., a thickness of 150 $\mu$m and a density of 0.917 as a hot-melt sheet was applied to a wafer by the application method M3 at a temperature of 140° C. After grinding a back face of the wafer to have a thickness of 280 $\mu$m, a release tape was applied to the back face of the hot-melt sheet and the hot-melt sheet was released together with the tape.

EXAMPLE 2

A hot-melt sheet was prepared by applying the pressure-sensitive adhesive A2 to an ethylene/ethyl acrylate copolymer film (EEA) having a melting point of 65° C. and a thickness of 150 $\mu$m at a dry thickness of 5 $\mu$m. The thus-obtained hot-melt sheet was applied to the wafer by the application method M2 at a temperature of 90° C. After grinding the back face of the wafer, the hot-melt sheet was released in the same manner as in Example 1.

EXAMPLE 3

The adhesive A1 was applied to one surface of an ethylene/vinyl acetate copolymer (ethylene content: 67% by weight) film (EVA-1) having a melting point of 60° C. and a thickness of 140 $\mu$m at a dry thickness of 15 $\mu$m. A polyethylene terephthalate film (PET) having a melting point of 250° C. and a thickness of 38 $\mu$m was applied as a reinforcing layer to the other surface of the EVA-1 film to obtain a hot-melt sheet. This hot-melt sheet was applied to the wafer by the application method M1 at a temperature of 80° C. After grinding the back surface of the wafer, the hot-melt sheet was released in the same manner as in Example 1.

EXAMPLE 4

The adhesive A1 was applied to one surface of an ethylene/vinyl acetate copolymer (ethylene content: 67% by weight) film (EVA-2) having a melting point of 60° C. and a thickness of 200 $\mu$m at a dry thickness of 40 $\mu$m. An aluminum foil having a thickness of 40 $\mu$m was applied as a reinforcing layer onto the other surface of the EVA-2 film to obtain a hot-melt sheet. This hot-melt sheet was applied to the wafer by the application method M1 at a temperature of 80° C. After grinding the back surface of the wafer, the hot-melt sheet was released in the same manner as in Example 1.

EXAMPLE 5

A polypropylene film (PP-1) having a melting point of 90° C. and a thickness of 180 $\mu$m was applied as a reinforcing layer to one surface of an ethylene/vinyl acetate copolymer (ethylene content: 86% by weight) film (EVA-3) having a melting point of 170° C. and a thickness of 40 $\mu$m to obtain a hot-melt sheet. This hot-melt sheet was applied to the wafer by the application method M3 at a temperature of 130° C. After grinding the back surface of the wafer, the hot-melt sheet was released in the same manner as in Example 1.

EXAMPLE 6

The adhesive A3 was applied to one surface of an ionomer film (IONO) having a melting point of 90° C. and a thickness of 300 $\mu$m at a dry thickness of 40 $\mu$m. A polyethylene terephthalate film having a melting point of 250° C. and a thickness of 38 $\mu$m was applied as a reinforcing layer to the other surface of the IONO film to obtain a hot-melt sheet. This hot-melt sheet was applied to the wafer by the application method M1 at a temperature of 100° C. After grinding the back surface of the wafer, the hot-melt sheet was UV-irradiated to thereby cure the adhesive layer and then released.

Comparative Example 1

A polyethylene film (PE-2) having a melting point of 118° C., a thickness of 100 $\mu$m and a density of 0.932 was applied to the wafer by the application method M1 at a temperature of 160° C. After grinding the back surface of the wafer, the hot-melt sheet was released in the same manner as in Example 1.

Comparative Example 2

The adhesive A2 was applied onto one surface of a polypropylene film (PP-2) having a melting point of 170° C. and a thickness of 100 $\mu$m at a dry thickness of 5 $\mu$m. A polyethylene terephthalate film (PET) having a melting point of 250° C. and a thickness of 38 $\mu$m was applied as a reinforcing layer to the other surface of the PP-2 film to obtain a hot-melt sheet. This hot-melt sheet was applied to the wafer by the application method M3 at a temperature of 200° C. After grinding the back surface of the wafer, the hot-melt sheet was released in the same manner as in Example 1.

Evaluation

Observation was made in each case of the above Examples and Comparative examples to examine whether or not the grinding water invaded between the hot-melt sheet and the wafer; whether or not the wafer suffered from cracking during the grinding step; and whether or not the hot-melt sheet could be easily released together with the release tape.

The results obtained are shown in Table 1.

TABLE 1

| | Hot melt sheet | | | | | | | | Application operation | | Evaluation | | |
|---|---|---|---|---|---|---|---|---|---|---|---|---|---|
| | Hot melt layer | | | Adhesive layer | | Reinforcing layer | | | | | | | |
| | Material | Thickness (μm) | M. P. (° C.) | Adhesive | Thickness (μm) | Material | Thickness (μm) | M. P. (° C.) | Method | Temp. (° C.) | Water invasion | Wafer cracking | Release |
| Ex. 1 | PE-1 | 150 | 98 | — | — | — | — | — | M3 | 140 | no | no | good |
| Ex. 2 | EEA | 100 | 65 | A2 | 5 | — | — | — | M2 | 90 | no | no | good |
| Ex. 3 | EVA-1 | 140 | 60 | A1 | 15 | PET | 38 | 250 | M1 | 80 | no | no | good |
| Ex. 4 | EVA-2 | 200 | 60 | A1 | 40 | A1 | 40 | — | M1 | 80 | no | no | good |
| Ex. 5 | EVA-3 | 180 | 90 | — | — | PP-1 | 40 | 170 | M3 | 130 | no | no | good |
| Ex. 6 | IONO | 300 | 90 | A3 | 40 | PET | 38 | 250 | M1 | 100 | no | no | good |
| C. Ex. 1 | PE-2 | 100 | 120 | — | — | — | — | — | M1 | 160 | no | yes | good |
| C. Ex. 2 | PP2 | 100 | 170 | A2 | 5 | PET | 38 | 250 | M3 | 200 | yes | yes | poor |

While the invention has been described in detail and with reference to specific embodiments thereof, it will be apparent to one skilled in the art that various changes and modifications can be made therein without departing from the spirit and scope thereof.

What is claimed is:

1. A method for applying a hot-melt sheet for holding and protecting semiconductor wafers to a surface of a semiconductor wafer, which comprises superposing a hot-melt sheet for holding and protecting semiconductor wafers by applying to a surface of a semiconductor wafer to thereby hold and protect the semiconductor wafer in processing the semiconductor wafer, the sheet comprising a hot-melt layer A having a melting point of 105° C. or lower, on a surface of the wafer, and applying the sheet to the surface of the wafer under heating.

2. The method as claimed in claim 1, wherein a reinforcing layer C having a melting point higher by 20° C. or more than that of said hot-melt layer A is formed on a surface of said hot-melt layer A opposite the surface facing the wafer.

3. A method for applying a hot-melt sheet for holding and protecting semiconductor wafers to a surface of a semiconductor wafer, which comprises superposing a hot-melt sheet for holding and protecting semiconductor wafers by applying to a surface of a semiconductor wafer to thereby hold and protect the semiconductor wafer in processing the semiconductor wafer, the sheet comprising a hot-melt layer A having a melting point of 105° C. or lower and a pressure-sensitive adhesive layer B formed on one surface thereof, in a manner such that the pressure-sensitive adhesive layer B faces the wafer, and applying the sheet to the surface of the wafer under heating.

4. The method as claimed in claim 3, wherein a reinforcing layer C having a melting point higher by 20° C. or more than that of said hot-melt layer A is formed on a surface of said hot-melt layer A opposite the surface having the pressure-sensitive adhesive layer B.

* * * * *